(12) United States Patent
Chang et al.

(10) Patent No.: US 11,920,244 B2
(45) Date of Patent: Mar. 5, 2024

(54) DEVICE HOUSING WITH METALLIC LUSTER

(71) Applicant: Hewlett-Packard Development Company, L.P., Spring, TX (US)

(72) Inventors: Chi-Hao Chang, Taipei (TW); Ya-Ting Yeh, Taipei (TW); Kuan-Ting Wu, Taipei (TW); Chih-Hsiung Liao, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 492 days.

(21) Appl. No.: 16/982,694

(22) PCT Filed: Jul. 24, 2018

(86) PCT No.: PCT/US2018/043543
§ 371 (c)(1),
(2) Date: Sep. 21, 2020

(87) PCT Pub. No.: WO2020/023022
PCT Pub. Date: Jan. 30, 2020

(65) Prior Publication Data
US 2021/0363646 A1 Nov. 25, 2021

(51) Int. Cl.
*C23C 28/00* (2006.01)
*C23C 14/16* (2006.01)
(Continued)

(52) U.S. Cl.
CPC ............ *C23C 28/345* (2013.01); *C23C 14/16* (2013.01); *C23C 28/322* (2013.01);
(Continued)

(58) Field of Classification Search
None
See application file for complete search history.

(56) References Cited

U.S. PATENT DOCUMENTS 6,335,099 B1 * 1/2002 Higuchi ................ C25D 11/30
205/333
2010/0025257 A1 2/2010 Gao
(Continued)

FOREIGN PATENT DOCUMENTS

CN 105385913 3/2016
RU 2285945 3/2007
(Continued)

OTHER PUBLICATIONS

Frank Hollstein et al., "Characteristics of PVD-coatings on AZ31hp magnesium alloys", Surface and Coatings Technology, Jan. 2003, pp. 261-268.
(Continued)

*Primary Examiner* — Samir Shah
(74) *Attorney, Agent, or Firm* — HP Inc. Patent Department

(57) ABSTRACT

The application discloses examples of a device housing of an electronic device including a magnesium-alloy substrate. The device housing further including a treatment layer applied over the magnesium-alloy substrate and a metallic coating layer applied over the treatment layer to provide a metallic luster. Further, a paint coating layer is disposed over a first portion of the metallic coating layer. Further, a top coating layer is applied over the paint coating layer and a visible second portion of the metallic coating layer.

13 Claims, 9 Drawing Sheets

```
TOP COATING LAYER 112
PAINT COATING LAYER 110
METALLIC COATING LAYER 108
TREATMENT LAYER 106
MAGNESIUM-ALLOY SUBSTRATE 104
```

(51) Int. Cl.
*C25D 11/02* (2006.01)
*C25D 11/30* (2006.01)
*G06F 1/16* (2006.01)

(52) U.S. Cl.
CPC ............ *C25D 11/026* (2013.01); *C25D 11/30* (2013.01); *G06F 1/1656* (2013.01)

(56) References Cited

U.S. PATENT DOCUMENTS

| | | |
|---|---|---|
| 2011/0097573 A1 | 4/2011 | Okuda et al. |
| 2011/0318603 A1 | 12/2011 | Okuda et al. |
| 2014/0008232 A1 | 1/2014 | Mizuno et al. |
| 2017/0226654 A1 | 8/2017 | Kashyap et al. |
| 2017/0306159 A1 | 10/2017 | Lang et al. |

FOREIGN PATENT DOCUMENTS

| | | |
|---|---|---|
| RU | 2005138509 | 6/2007 |
| RU | 2335521 | 10/2008 |

OTHER PUBLICATIONS

H. Hoche et al., "Design of wear and corrosion resistant PVD-coatings for magnesium alloys", Mat.-wiss. u. Werkstofftech. 2007, 38, No. 5, pp. 365-371.

Holger Hoche et al., "Development of New PVD coatings for magnesium alloys with improved corrosion properties", Surf. Coat. Techno. (2014), pp. 1-7.

Tomasz Tanski "Characteristics of Hard Coatings on AZ61 Magnesium Alloys", Journal of Mechanical Engineering 59(2013)3, 165-174.

\* cited by examiner

DEVICE HOUSING WITH METALLIC LUSTER

BACKGROUND

With the increase in the popularity of electronic devices, such as a laptop, there has been an emphasis on enhancing aesthetics of the devices in addition to configuration and functions performed by the devices. For instance, to enhance the aesthetics, a lustrous finish, such as a metal finish, may be provided to an exterior surface of a display, input interfaces, and a device housing, such as a back cover and base frame of the devices.

BRIEF DESCRIPTION OF DRAWINGS

The detailed description is described with reference to the accompanying figures. It should be noted that the description and figures are merely examples of the present application and are not meant to represent the application itself.

Figure 1:
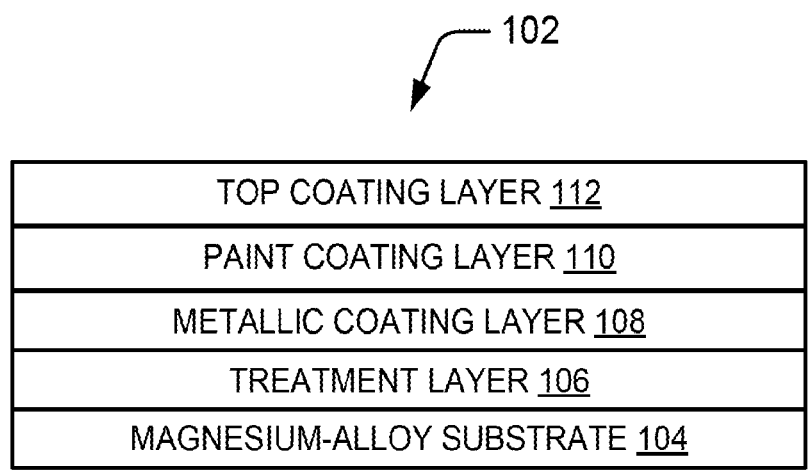
FIG. 1 illustrates a device housing, according to an example of the present application.

Throughout the drawings, identical reference numbers designate similar, but not necessarily identical, elements. The figures are not necessarily to scale, and the size of some parts may be exaggerated to more clearly illustrate the example shown. Moreover, the drawings provide examples consistent with the description; however, the description is not limited to the examples provided in the drawings.

DETAILED DESCRIPTION

Definitions

For convenience, before further description of the present disclosure, certain terms employed in the specification, and examples are collected here. These definitions should be read in the light of the remainder of the disclosure and understood as by a person of skill in the art. The terms used herein have the meanings recognized and known to those of skill in the art, however, for convenience and completeness, particular terms and their meanings are set forth below.

The articles "a", "an" and "the" are used to refer to one or to more than one (i.e., to at least one) of the grammatical object of the article.

The term "about" when referring to a numerical value is intended to encompass the values resulting from variations that can occur during the normal course of performing a method. Such variations are usually within plus or minus 10 percent of the stated numerical value.

The term "weight percentage of a component" used herein refers to percentage weight of that component relative to 100% weight of the composition.

The term "immersed" used herein refers to full immersion of the object in a solution, such that no part of the object being immersed is exposed to an environment other than the solution in which the object is immersed.

Electronic devices, such as a laptop, a tablet, and a mobile phone, are widely used for personal purposes in addition to office use. While making purchase decisions, consumers often evaluate the electronic devices based on aesthetics and ease of use in addition to assessing the electronic devices based on their configuration. For instance, to enhance the aesthetics, a lustrous finish, such as a metal finish, may be provided to an exterior surface of the laptop. Generally, the electronic devices are made of metal or non-metal substrates. The substrates may either form the electronic device, or may form a device housing of the electronic device which may house multiple components of the electronic device.

To provide strength and appealing appearance to the electronic devices, durable substrates are utilized. However, to keep the electronic devices light and portable, substrates made from metals including aluminum and magnesium are generally utilized. While such substrates are light, directly providing any lustrous texture or finish on these substrates is difficult due to their poor color stability, hardness, and chemical resistance. For instance, magnesium-alloy substrate may get oxidized on the surface owing to which the magnesium-alloy substrate may not be fabricated for obtaining metallic luster. The magnesium-alloy substrate may thus be covered with either a paint coating or a powder coating to prevent any part of the magnesium-alloy substrate from getting exposed and oxidized.

Further, the magnesium-alloy substrate may be coated with a metal or a paint layer, which may include, for instance, metal particles. However, such coatings may involve complex and time-consuming surface treatment processes due to high reactivity of the magnesium-alloy substrate and high porosity on surface of the magnesium-alloy substrate. Another technique for enhancing the aesthetics may include electroplating an exterior surface of the device housing. However, metallic surfaces obtained by electroplating may be vulnerable to corrosion. Further, in some cases, metal particles used in the electroplating and metal or paint layer may interfere with the working of components, such as an antenna of the electronic device. This, in turn may adversely affect the performance of the antenna, and hence, the electronic device.

The present application discloses examples of a device housing for an electronic device, such as a laptop. In accordance to the present application, the device housing includes a magnesium-alloy substrate and a plurality of coating layers deposited over the magnesium-alloy substrate. The magnesium-alloy substrate may include magnesium, titanium, zinc, and an element selected from the group consisting of aluminum and lithium. The plurality of coating layers includes a metallic coating layer and a treatment layer. The metallic coating layer provides a metallic luster and a glossy surface to the device housing. In an example, the metallic coating layer may provide a metallic surface and/or a glossy surface with a gloss value from 70 to 98 units as measured by American Society for Testing and Materials (ASTM) D523 at a 60° viewing angle. In another example, the metallic coating layer may provide a glossy surface with a gloss value from 85 to 95 units as measured by ASTM D523 at a 60° viewing angle. Further, the treatment layer helps in providing hardness and surface protection to the magnesium-alloy substrate from corrosion.

In one example of the present application, the magnesium-alloy substrate of the device housing is chemically treated to form a treatment layer over the magnesium-alloy substrate. In one example, the treatment layer may be an oxide layer formed by oxidizing the magnesium-alloy substrate through micro-arc oxidation (MAO) process. In another example, the treatment layer may be a passivation layer formed by chemically treating a surface of the magnesium-alloy substrate with a passivation chemical.

Subsequently, a metallic coating layer may be applied over the treatment layer. The metallic coating layer may be applied using one of a non-conductive vacuum metallization (NCVM) process, a physical vapor deposition (PVD), and a vacuum metallization (VM) process. The metallic coating layer may be further subjected to spray painting to deposit a paint coating layer over the metallic coating layer. The paint coating layer may help in providing color to the device housing, thereby increasing the aesthetic appeal of the electronic device. In one example, the paint coating layer may include one of a base coating layer and a combination of a base coating layer and a primer coating layer.

Further, in one example, a portion of the paint coating layer may be cut using one of diamond cutting and laser cutting process to allow a second portion of the metallic coating layer to be visible. Making the second portion of the metallic coating layer to be visible helps in providing a metallic luster to those parts of the device housing that are covered by the second portion of the metallic coating layer. Subsequently, a top coating layer may be applied over the paint coating layer and the second portion of the metallic coating layer. The top coating layer may help in protecting the paint coating layer and the second portion of the metallic coating layer from abrasion.

The present application thus provides an aesthetically appealing device housing having a metallic surface finish. Using the NCVM and PVD process for applying the metallic coating layer helps in providing a lustrous metallic finish without affecting the functioning of the electronic device as the NCVM does not interfere with the components of the electronic device. Further, the treatment layer, such as the oxide layer and the passivation layer may help in providing resistance against corrosion and wear. The treatment layer may further help in providing electrical insulation and durability to the magnesium-alloy substrate based device housing.

The present application is further described with reference to FIGS. 1 to 9. It should be noted that the description and figures merely illustrate principles of the present application. Various arrangements may be devised that, although not explicitly described or shown herein, encompass the principles of the present application. Moreover, all statements herein reciting principles, aspects, and examples of the present application, as well as specific examples thereof, are intended to encompass equivalents thereof.

FIG. 1 illustrates a device housing 102 for an electronic device, according to an example of the present application. Examples of the electronic device include, but are not limited to, laptops, computing devices, mobile phones, personal digital assistants, tablets, and printing devices, such as printers and scanners. The device housing 102 may be a frame or housing of the electronic device and may house multiple components of the electronic device. In one example, the device housing 102 may be formed using a magnesium-alloy substrate 104. The magnesium-alloy substrate may include magnesium, titanium, zinc, and an element selected from the group consisting of aluminum and lithium.

The device housing 102 further includes a treatment layer 106 applied over the magnesium-alloy substrate 104. In one example, the treatment layer 106 may be an oxide layer formed using a micro-arc oxidation (MAO) process. In another example, the treatment layer 106 may be a passivation layer formed by chemically treating a surface of the magnesium-alloy substrate 104 with a passivation chemical. The formation and specification of the treatment layer 106 are further described in detail in FIGS. 3-9.

The device housing 102 further includes a metallic coating layer 108 applied over the treatment layer 106 to provide a metallic luster to the device housing 102. In one example, the metallic coating layer 108 may be a non-conductive vacuum metallization (NCVM) coating. In another example, the metallic coating layer 108 may be a physical vapor deposition (PVD) coating. In another example, the metallic coating layer 108 may be a vacuum metallization (VM) coating. The formation and specification of the metallic coating layer 108 are further described in detail in FIGS. 3-9.

The device housing 102 further includes a paint coating layer 110 disposed over a first portion of the metallic coating layer 108. In one example, the paint coating layer 110 may be initially applied over the metallic coating layer 108. Subsequently, the paint coating layer 110 may be etched using one of diamond cutting and laser cutting process such that a first part of the paint coating layer 110 remains applied over a first portion of the metallic coating layer 108 and a second part of the paint coating layer 110 is removed from over a second portion of the metallic coating layer 108. Thus, the second portion of the metallic coating layer 108 becomes visible, to provide a metallic luster to the device housing 102. The formation and specification of the paint coating layer 110 are further described in detail in FIGS. 3-9.

The device housing 102 further includes a top coating layer 112 applied over the paint coating layer 110 and a visible second portion of the metallic coating layer 108. The formation and specification of the top coating layer 112 are further described in detail in FIGS. 3-9.

Figure 2:
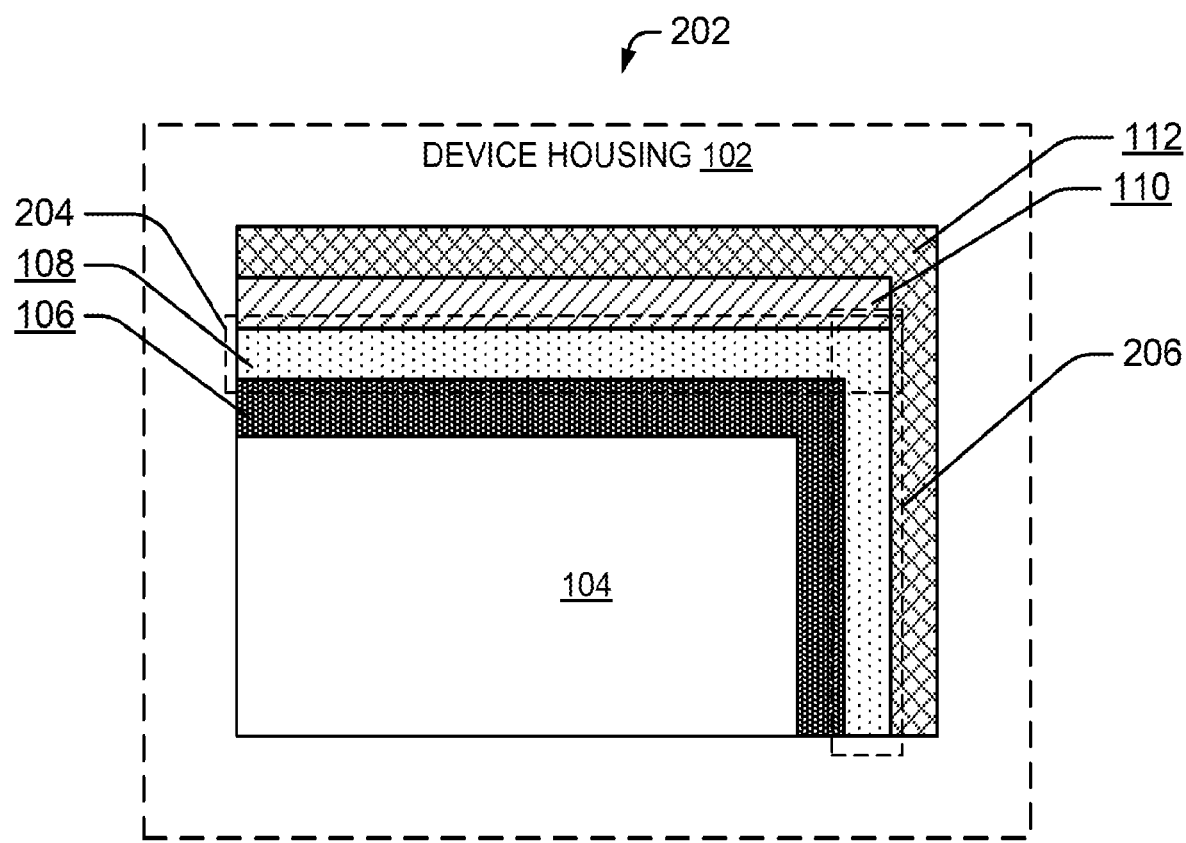
FIG. 2 illustrates an electronic device having a device housing, according to another example of the present application.

FIG. 2 illustrates an electronic device 202 having the device housing 102 to house different components of the electronic device 202, according to another example of the present application. The device housing 102 includes the magnesium-alloy substrate 104 and a plurality of coating layers deposited over the magnesium-alloy substrate. The plurality of coating layers includes at least the treatment layer 106, the metallic coating layer 108, the top coating layer 112, and the paint coating layer 110. The paint coating layer 110 may include one of a base coating layer or a combination of a base coating layer and a primer coating layer.

In one example, the paint coating layer is disposed on a first portion 204 of the metallic coating layer 108, while a second portion 206 of the metallic coating layer 108 is visible to provide a metallic luster on the surface of the device housing 102.

FIGS. 3 to 8 illustrate various embodiments, compositions, and process of fabrication of the device housing 102 including the treatment layer 106, the metallic coating layer 108, the top coating layer 112, and the paint coating layer 110. For the sake of brevity and not as a limitation, the thickness, composition, and method of fabrication of different layers is provided in the Figures in which they are first introduced and not repeated in the remaining Figures. The thickness, composition, and method of fabrication of any layer in the remaining Figures is same as described in the Figure in which the layer is first introduced.

Figure 3:
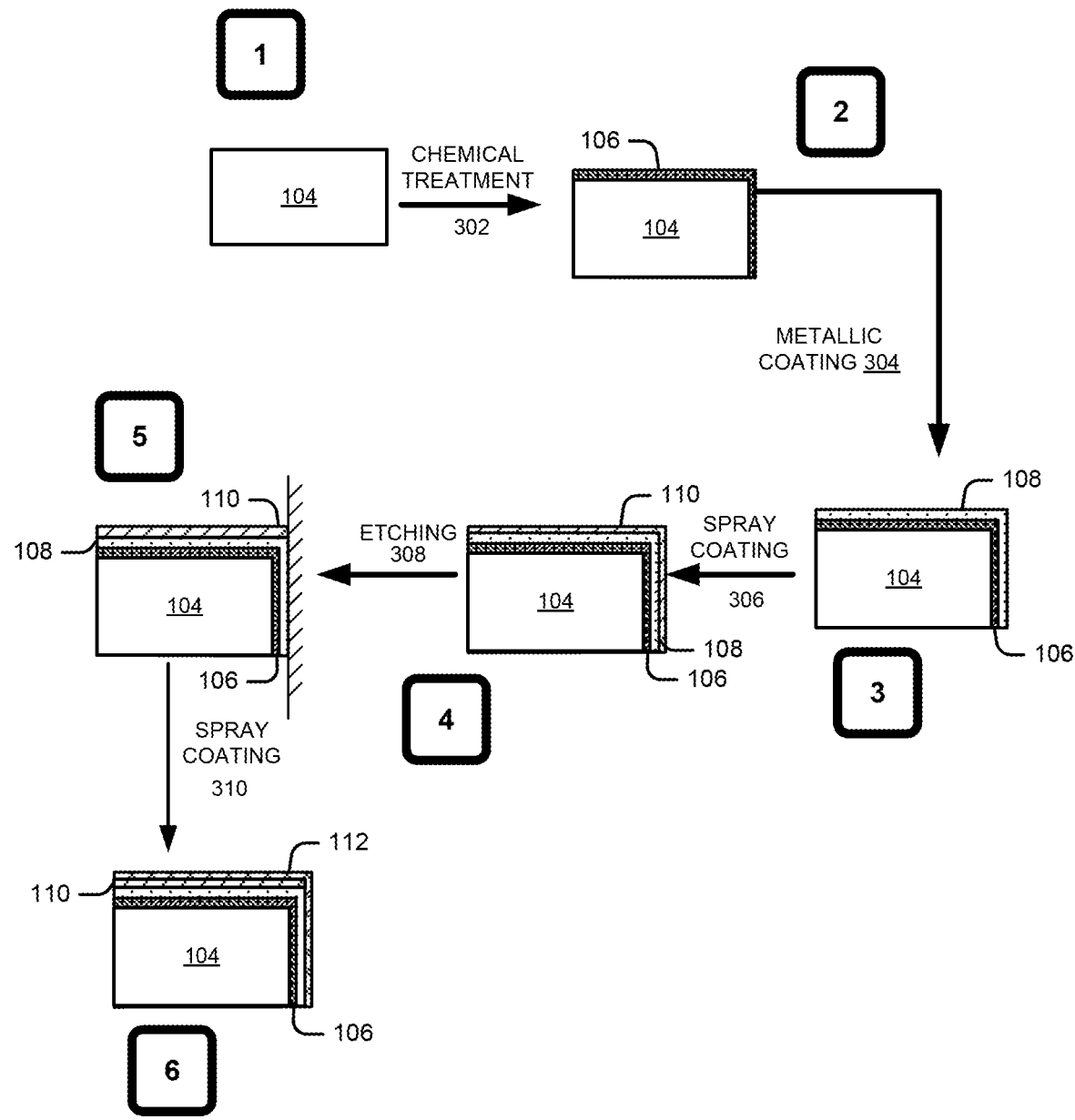
FIG. 3 illustrates different stages of fabrication of a device housing, according to an example of the present application.

FIG. 3 illustrates different stages of fabrication of the device housing 102, according to an example of the present application. The different stages of fabrication of the device housing 102 are marked from stage 1 to stage 6. At stage 1, the magnesium-alloy substrate 104 is manufactured, as a chassis for the device housing 102. As previously described, the magnesium-alloy substrate 104 may include magnesium, titanium, zinc, and an element selected from the group consisting of aluminum and lithium. In one example, the magnesium-alloy substrate 104 may be formed using a magnesium-alloy including magnesium, aluminum, and zinc. In said example, the magnesium-alloy includes magnesium in 9 weight percent aluminum and 1 weight percent zinc. In another example, the magnesium-alloy substrate 104 may be formed using a magnesium-alloy including magnesium, lithium, and zinc. In said example, the magnesium-alloy includes magnesium in 9 weight percent lithium and 1 weight percent zinc. In another example, the magnesium-alloy includes magnesium in 3 weight percent aluminum and 1 weight percent zinc. In another example, the magnesium-alloy includes magnesium in 14 weight percent lithium and 1 weight percent zinc. In another example, the magnesium-alloy includes magnesium in 4 weight percent aluminum, 9 weight percent lithium, and 1 weight percent zinc.

At stage 1, the magnesium-alloy may be cast to form the magnesium-alloy substrate 104. For instance, the magnesium-alloy may be sand cast or die cast to form the magnesium-alloy substrate 104. The magnesium-alloy substrate 104 may be further machined. For instance, the magnesium-alloy substrate 104 may be machined to form the chassis for the device housing 102, to accommodate various elements of the electronic device 202. An example of machining is computer numerical control (CNC) machining. The magnesium-alloy substrate 104 may further be surface treated. For instance, the magnesium-alloy substrate 104, such as a cast magnesium-alloy substrate that has been machined, may be surface treated prior to further preparation of the substrate. Examples of surface treatment include, but are not limited to cleaning and polishing. The surface treatment may be utilized to remove, for example, oxides, hydroxides, and/or excess lubricant from the magnesium-alloy substrate 104.

A top surface of the magnesium-alloy substrate 104 may then be subjected to chemical treatment 302 at stage 2 to form the treatment layer 106. As previously described, the treatment layer 106 may be one of the oxide layer or the passivation layer. The treatment layer 106 may help in providing resistance against corrosion and wear. The treatment layer 106 may further help in providing electrical insulation and durability to the magnesium-alloy substrate 104.

The oxide layer may be formed using the MAO process. The MAO may include electrolysis of an electrolyte solution with the magnesium-alloy substrate 104 fully immersed in the electrolyte solution. The electrolyte solution may be an alkaline solution having electrolytes selected from the group consisting of sodium silicate, sodium phosphate, potassium fluoride, potassium hydroxide, sodium hydroxide, fluorozirconate, sodium hexametaphosphate, sodium fluoride, aluminum oxide, silicon dioxide, ferric ammonium oxalate, phosphoric acid salt, polyethylene oxide alkylphenolic ether, and combinations thereof.

In an example, the electrolyte solution may be kept inside an electrolytic bath and maintained at a temperature in a range of about 10° C. to about 45° C. In another example, the electrolyte solution may be kept inside an electrolytic bath and maintained at a temperature in a range of about 15° C. to about 40° C. In another example, the electrolyte solution may be kept inside an electrolytic bath and maintained at a temperature in a range of about 20° C. to about 35° C. In another example, the electrolyte solution may be kept inside an electrolytic bath and maintained at a temperature in a range of about 25° C. to about 30° C.

The top surface of the magnesium-alloy substrate 104 is then immersed in the electrolyte solution inside the electrolytic bath. The magnesium-alloy substrate 104 acts as an electrode during electrolysis of the electrolyte solution. At the end of the electrolysis, the oxide layer may be formed on the magnesium-alloy substrate 104. The thickness of the oxide layer may depend on the definite time period for which the electrolysis is performed. In one example, the oxide layer has a thickness in a range of about 3 micro meter ($\mu$m) to about 15 $\mu$m. In another example, the oxide layer has a thickness in a range of about 4.5 $\mu$m to about 12.5 $\mu$m. In another example, the oxide layer has a thickness in a range of about 6 $\mu$m to about 11 $\mu$m. In another example, the oxide layer has a thickness in a range of about 7.5 $\mu$m to about 9.5 $\mu$m. In another example, the oxide layer has a thickness in a range of about 3 $\mu$m to about 7 $\mu$m.

Further, the magnesium-alloy substrate 104 having the oxide layer as the treatment layer 106, may be heated for a time duration in a range of about 10 minutes to 30 minutes, to dry the oxide layer. In one example, the oxide layer may be heated for a time duration in a range of about 15 minutes to 25 minutes. In another example, the oxide layer may be heated for a time duration in a range of about 17.5 minutes to 22.5 minutes. Further, the oxide layer may be heated at a temperature in a range of about 60° C. to 80° C. In one example, the oxide layer may be heated at a temperature in a range of about 65° C. to 75° C. In another example, the oxide layer may be heated at a temperature in a range of about 67.5° C. to 72.5° C.

In case the treatment layer 106 is a passivation layer, the treatment layer 106 may be formed by chemically treating a surface of the magnesium-alloy substrate 104 with a passivation chemical. The passivation chemical may be selected from the group consisting of molybdates, vanadates, phosphates, chromates, stannates, manganese salts, and combinations thereof. To form the passivation layer, the top surface of the magnesium-alloy substrate 104 may be chemically treated using the passivation chemical such that the top surface may react with the passivation chemical and turn into a non-metallic surface, such as a salt film.

In one example, the magnesium-alloy substrate 104 may be chemically treated for a time duration in a range of about 0.5 minutes to 3 minutes and at a temperature range of about 25° C. to 40° C. to obtain the passivation layer. In another example, the magnesium-alloy substrate 104 may be chemically treated for a time duration in a range of about 1 minute to 2 minutes and at a temperature range of about 25° C. to 40° C. In another example, the magnesium-alloy substrate 104 may be chemically treated for a time duration in a range of about 1 minute to 2 minutes and at a temperature range of about 27.5° C. to 37.5° C. In another example, the magnesium-alloy substrate 104 may be chemically treated for a time duration in a range of about 1 minute to 2 minutes and at a temperature range of about 30° C. to 35° C. In another example, the magnesium-alloy substrate 104 may be chemically treated for a time duration in a range of about 0.5 minutes to 3 minutes and at a temperature range of about 25° C. to 40° C. In another example, the magnesium-alloy substrate 104 may be chemically treated for a time duration in a range of about 0.5 minutes to 3 minutes and at a temperature range of about 27.5° C. to 37.5° C. In another example, the magnesium-alloy substrate 104 may be chemically treated for a time duration in a range of about 1.5 minutes to 2.5 minutes and at a temperature range of about 25° C. to 40° C. In another example, the magnesium-alloy substrate 104 may be chemically treated for a time duration in a range of about 1.5 minutes to 2.5 minutes and at a temperature range of about 27.5° C. to 37.5° C. In another example, the magnesium-alloy substrate 104 may be chemically treated for a time duration in a range of about 1.5 minutes to 2.5 minutes and at a temperature range of about 30° C. to 35° C.

The non-metallic surface thus formed over the magnesium-alloy substrate 104, acts as the passivation layer. In one example, the passivation layer has a thickness in a range of about 1 µm to about 5 µm. In another example, the passivation layer has a thickness in a range of about 1.5 µm to about 4.5 µm. In another example, the passivation layer has a thickness in a range of about 2 µm to about 4 µm. In another example, the passivation layer has a thickness in a range of about 2.5 µm to about 3.5 µm.

The treatment layer coated magnesium-alloy substrate 104 may be further subjected to metallic coating 304 to apply the metallic coating layer 108 at stage 3. The metallic coating layer 108 provides a metallic luster and a glossy surface to the device housing 102. In one example, the metallic coating layer 108 may provide a metallic luster and/or a glossy surface with a gloss value from 70 to 98 units as measured by American Society for Testing and Materials (ASTM) D523 at a 60° viewing angle. In another example, the metallic coating layer 108 may provide a glossy surface with a gloss value from 75 to 95 units as measured by ASTM D523 at a 60° viewing angle. In another example, the metallic coating layer 108 may provide a glossy surface with a gloss value from 85 to 90 units as measured by ASTM D523 at a 60° viewing angle.

In one example, the metallic coating layer 108 may have a thickness in a range of from about 30 nanometer (nm) to about 1 µm. In another example, the metallic coating layer 108 may have a thickness in a range of from about 100 nm to about 900 nm. In another example, the metallic coating layer 108 may have a thickness in a range of from about 200 nm to about 800 nm. In another example, the metallic coating layer 108 may have a thickness in a range of from about 300 nm to about 700 nm. In another example, the metallic coating layer 108 may have a thickness in a range of from about 400 nm to about 600 nm.

In one example, the metallic coating layer 108 may be one of the NCVM coating, PVD coating, or the VM coating. The NCVM coating, the PVD coating, and the VM coating are made of a material selected from the group consisting of titanium, chromium, nickel, zinc, zirconium, manganese, copper, aluminum, tin, molybdenum, tantalum, tungsten, hafnium, gold, vanadium, silver, platinum, graphite, stainless steel, and alloy combinations thereof. In one example, the NCVM coating, the PVD coating, and the VM coating may be made of an alloy having zinc and aluminum. In said example, zinc has a weight percentage in the range of 1-10% and aluminum has a weight percentage in the range of 90-99%. In another example, zinc has a weight percentage in the range of 3-7% and aluminum has a weight percentage in the range of 93-97%. In another example, zinc has a weight percentage in the range of 5-10% and aluminum has a weight percentage in the range of 90-95%. In another example, zinc has a weight percentage in the range of 1-5% and aluminum has a weight percentage in the range of 95-99%.

The NCVM coating, the PVD coating, and the VM coating may also be made of an alloy of titanium and aluminum. In said example, titanium has a weight percentage in the range of 20-30% and aluminum has a weight percentage in the range of 70-80%. In another example, titanium has a weight percentage in the range of 20-25% and aluminum has a weight percentage in the range of 75-80%. In another example, titanium has a weight percentage in the range of 25-30% and aluminum has a weight percentage in the range of 70-75%.

Further, the NCVM coating, the PVD coating, and the VM coating may be made of an alloy of silicon and aluminum. In said example, silicon has a weight percentage in the range of 30-40% and aluminum has a weight percentage in the range of 60-70%. In another example, silicon has a weight percentage in the range of 30-35% and aluminum has a weight percentage in the range of 65-70%. In another example, silicon has a weight percentage in the range of 35-40% and aluminum has a weight percentage in the range of 60-65%.

Further, the NCVM coating, the PVD coating, and the VM coating may be made of an alloy of zinc and tin. In said example, zinc has a weight percentage in the range of 70-85% and tin has a weight percentage in the range of 15-30%. In another example, zinc has a weight percentage in the range of 75-85% and tin has a weight percentage in the range of 15-25%. In another example, zinc has a weight percentage in the range of 70-80% and tin has a weight percentage in the range of 20-30%.

The PVD coating may be applied over the treatment layer 106 using a process of physical vapor deposition. Examples of physical vapor deposition include ion-beam sputtering, reactive sputtering, ion-assisted deposition, high-target-utilization sputtering, high-power impulse magnetron sputtering, gas flow sputtering, and chemical vapor deposition. To apply the PVD coating over the treatment layer 106, the material selected from the list of materials provided above may be vaporized in a high vacuum environment and deposited on the treatment layer 106. In one example, the PVD coating may be applied under a pressure in a range of about $10^{-3}$ Torr-$10^{-4}$ Torr and at a temperature range of about 120° C. to 250° C. In another example, the PVD coating may be applied under a pressure in a range of about $10^{-3}$ Torr-$10^{-4}$ Torr and at a temperature range of about 200° C. to 250° C. In another example, the PVD coating may be applied under a pressure in a range of about $10^{-3}$ Torr-$10^{-4}$ Torr and at a temperature range of about 150° C. to 200° C. In another example, the PVD coating may be applied under a pressure in a range of about $10^{-3}$ Torr-$10^{-4}$ Torr and at a temperature range of about 175° C. to 225° C.

The NCVM coating may be applied over the treatment layer 106 using a process of non-conductive vacuum metallization. The VM coating may be applied over the treatment layer 106 using a process of vacuum metallization. In one example, the NCVM coating and the VM coating may be applied under a pressure in a range of about $10^{-3}$ Torr-$10^{-4}$ Torr and at a temperature range of about 25° C. to 90° C. In another example, the NCVM coating and the VM coating may be applied at a temperature in a range of about 35° C. to 70° C. In another example, the NCVM coating and the VM coating may be applied at a temperature in a range of about 50° C. to 65° C. In another example, the NCVM coating and the VM coating may be applied at a temperature in a range of about 30° C. to 80° C.

In one example, before applying the metallic coating layer 108, a clear primer coating layer (not illustrated in this Figure) may be applied over the treatment layer 106. Applying the clear primer coating layer helps in improving the deposition rate and performance of the metallic coating layer 108. The clear primer coating layer includes optical polymers selected from the group consisting of polyacrylic, polycarbonate, cyclic olefin copolymer (COC), and combinations thereof. In one example, the clear primer coating layer may have a thickness in a range of from about 10 μm to about 30 μm. In another example, the clear primer coating layer may have a thickness in a range of from about 15 μm to about 25 μm. In another example, the clear primer coating layer may have a thickness in a range of from about 18 μm to about 22 μm.

The clear primer coating layer may be applied using a process of spray painting. In one example, the clear primer coating layer may be spray coated onto the substrate for a time period of about 20 to 60 minutes, and at a temperature range of about 50° C. to 110° C. In another example, the clear primer coating layer may be spray coated onto the substrate for a time period of about 40 minutes at about 80° C. In another example, the clear primer coating layer may be spray coated onto the substrate for a time period of about 30 to 50 minutes, and at a temperature range of about 50° C. to 110° C. In another example, the clear primer coating layer may be spray coated onto the substrate for a time period of about 30 to 50 minutes, and at a temperature range of about 70° C. to 90° C. In another example, the clear primer coating layer may be spray coated onto the substrate for a time period of about 35 to 45 minutes, and at a temperature range of about 70° C. to 90° C. In another example, the clear primer coating layer may be spray coated onto the substrate for a time period of about 35 to 45 minutes, and at a temperature range of about 50° C. to 110° C.

The metallic coating layer and treatment layer coated magnesium-alloy substrate 104 may be further subjected to spray coating 306 to apply the paint coating layer 110 over the metallic coating layer 108 at stage 4. The paint coating layer 110 may include one of a base coating layer, a clear coating layer, a primer coating layer, and combination thereof. In one example, the paint coating layer 110 may include a clear coating layer applied over the metallic coating layer 108 and a base coating layer applied over the clear coating layer. In another example, the paint coating layer 110 may include the clear coating layer applied over the metallic coating layer 108, the primer coating layer applied over the clear coating layer, and the base coating layer applied over the primer coating layer. In another example, the paint coating layer 110 may include the primer coating layer applied over the metallic coating layer 108 and the base coating layer applied over the primer coating layer.

Each coating layer may provide a defined functionality. For example, the base coating layer may provide a colored texture to the device housing. The primer coating layer may act as an adhesive between the metallic coating layer 108 and the base coating layer. The primer coating layer may alternately act as an adhesive between clear coating layer and the base coating layer. The clear coating layer may act as buffer layer that may be retained over the metallic coating layer 108, after the primer coating layer and the base coating layer are removed to expose the metallic coating layer 108 for providing metallic luster. The formation and specification of each of the base coating layer, the clear coating layer, and the primer coating layer is further described in detail in FIGS. 5-7.

The magnesium-alloy substrate 104 coated with the paint coating layer 110, the metallic coating layer 108, and the treatment layer 106 may be further subjected to etching 308 using either diamond cutting or laser cutting at stage 5. In one example, a portion of the paint coating layer 110 may be etched such that the paint coating layer 110 remains over the first portion 204 of the metallic coating layer 108, while the paint coating layer 110 is removed from over the second portion 206 of the metallic coating layer 108. The second portion 206 of the metallic coating layer 108 thus becomes visible, providing a metallic luster on the surface of the device housing 102.

Further, in one example, the paint coating layer 110 may be partially removed from over the second portion 206 of the metallic coating layer 108, such that the clear coating layer is retained over the second portion 206, while the base coating layer and the primer coating layer are removed from over the second portion 206. In another example, the paint coating layer 110 may be removed in entirety from over the second portion 206 of the metallic coating layer 108, such that the second portion 206 is directly visible and exposed to the environment.

In one example, the second portion 206 of the metallic coating layer 108 may correspond to edges of the device housing 102, while the first portion 204, still covered by the paint coating layer 110 may correspond to other parts of the device housing 102.

Further, the paint coating layer 110 and the second portion 206 of the metallic coating layer 108 may be subjected to spray coating 310 to apply the top coating layer 112 at stage 6. The spray coating 310 of the top coating layer 112 after the etching 308 may provide protection to the second portion 206 of the metallic coating layer 108 and the paint coating layer 110 from any unwanted abrasions. The top coating layer 112 may include resins selected from the group consisting of polyurethane, polycarbonate, urethane acrylates, ployacrylate, polystyrene, polyetheretherketone, polyesters, fluoropolymers, and combinations thereof.

In one example, the top coating layer 112 has a thickness in a range of from about 10 μm to about 25 μm. In another example, the top coating layer 112 has a thickness in a range of from about 12 μm to about 20 μm. In another example, the top coating layer 112 has a thickness in a range of from about 15 μm to about 18 μm. Further, the top coating layer 112 may be spray coated at a temperature range of about 60 to 90° C., for about 20 to 40 minutes. In one example, the top coating layer 112 may be spray coated at a temperature range of about 65 to 85° C. In another example, the top coating layer 112 may be spray coated at a temperature range of about 70 to 80° C. Further, in one example, the top coating layer 112 may be spray coated for a time period of about 25 to 35 minutes. In another example, the top coating layer 112 may be spray coated for a time period of about 27 to 32 minutes.

Figure 4:
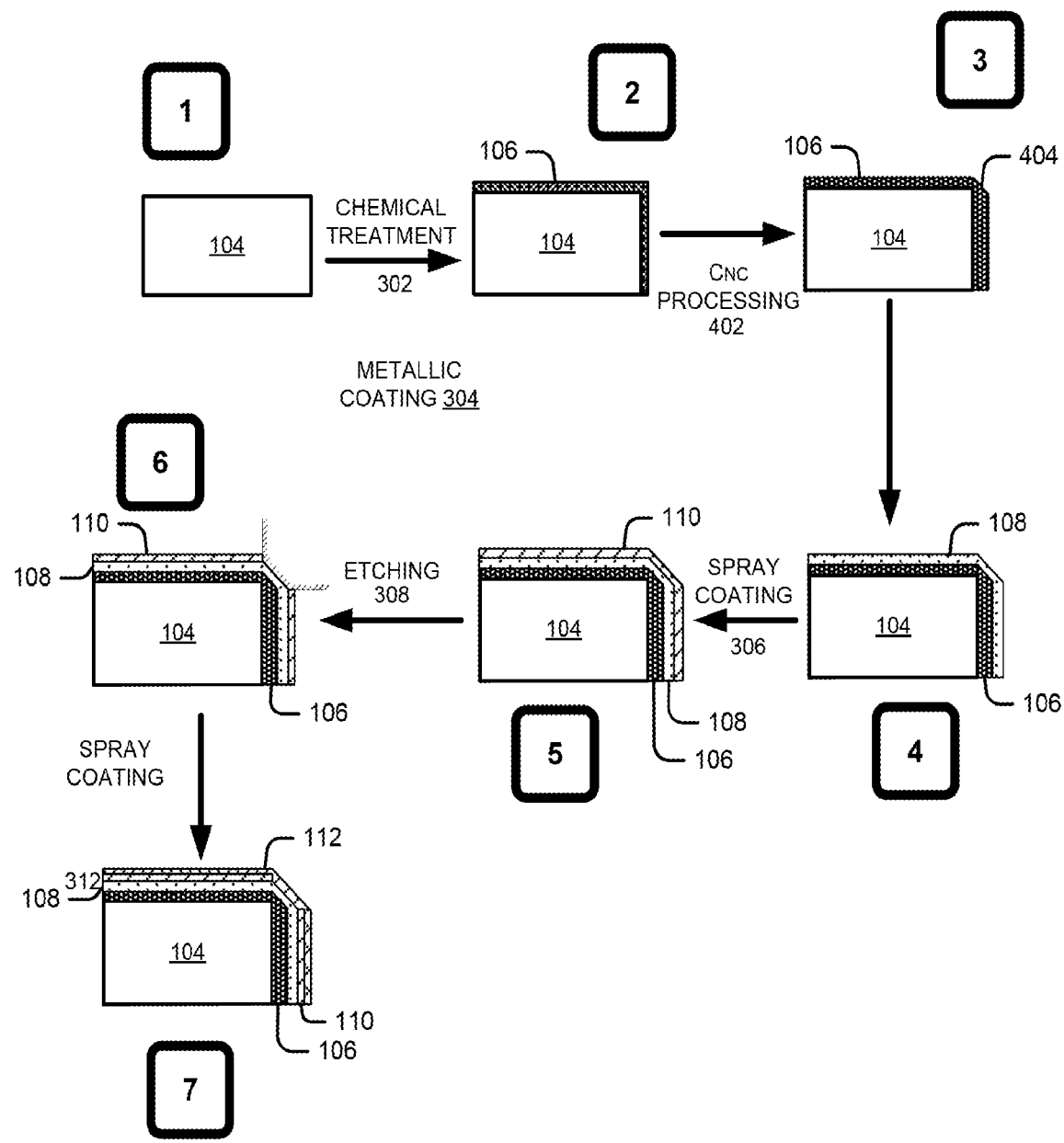
FIG. 4 illustrates different stages of fabrication of a device housing, according to another example of the present application.

FIG. 4 illustrates different stages of fabrication of the device housing 102, according to another example of the present application. As previously described, at stage 1, the magnesium-alloy substrate 104 is manufactured, as a chassis for the device housing 102. Subsequently, at stage 2, the top surface of the magnesium-alloy substrate 104 may be subjected to the chemical treatment 302 to form the treatment layer 106.

The treatment layer coated magnesium-alloy substrate 104 may be further subjected to CNC processing 402 at stage 3. The CNC processing may be performed on the magnesium-alloy substrate 104 using a diamond cutter to form a chamfer 404 having a glossy surface. In one example, a corner of treatment layer 106 and the magnesium-alloy substrate 104 may be cut by CNC processing using the diamond cutter to form the chamfer 404. The term "chamfer" used herein refers to a symmetrical sloping surface at an edge or corner. The term "chamfer" may indicate a portion of the magnesium-alloy substrate 104 corresponding to a slope or edge of the device housing 102 of the electronic device 202. For instance, chamfer may refer to an edge of a side wall of the electronic device 202, such as a laptop.

The treatment layer coated magnesium-alloy substrate 104 having the chamfer 404 may be further subjected to metallic coating 304 to apply the metallic coating layer 108 at stage 4. In one example, before applying the metallic coating layer 108, the clear primer coating layer (not illustrated in this Figure) may be applied over the treatment layer 106.

The metallic coating layer and treatment layer coated magnesium-alloy substrate 104 having the chamfer 404 may be further subjected to spray coating 306 to apply the paint coating layer 110 over the metallic coating layer 108 at stage 5. The magnesium-alloy substrate 104 coated with the paint coating layer 110, the metallic coating layer 108, and the treatment layer 106 and having the chamfer may be further subjected to etching 308 using either diamond cutting or laser cutting at stage 5. In one example, a portion of the paint coating layer 110 may be etched such that the paint coating layer 110 remains over the first portion 204 of the metallic coating layer 108, while the paint coating layer 110 is removed from over the second portion 206 of the metallic coating layer 108. In one example, the second portion 206 of the metallic coating layer 108 may correspond to the chamfer 404. In another example, the second portion 206 of the metallic coating layer 108 may correspond to the chamfer 404 and the second portion 206 as previously described.

Further, the paint coating layer 110 and the second portion 206 of the metallic coating layer 108 may be subjected to spray coating 310 to apply the top coating layer 112 at stage 7.

Figure 5:
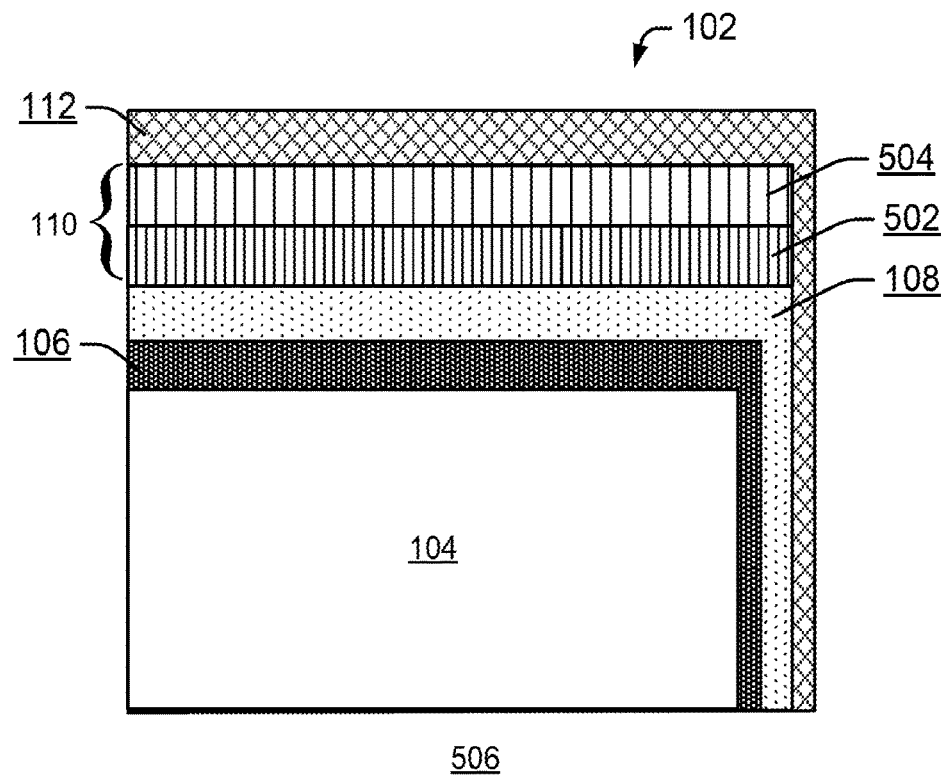
FIG. 5 illustrates a device housing, according to an example of the present application.
Figure 5:
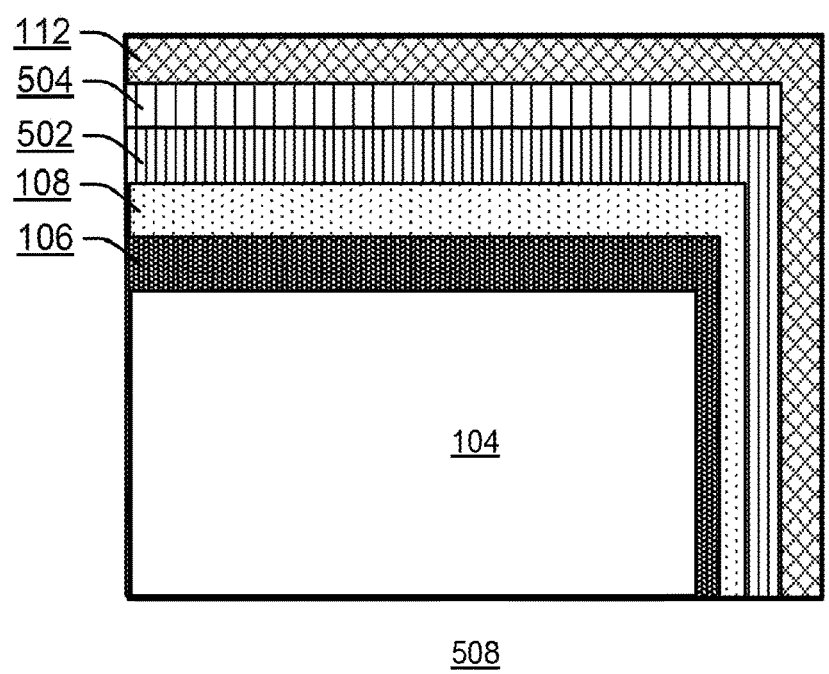

FIG. 5 illustrates the device housing, according to an example of the present application. The device housing in one example is the device housing 102 as previously described and may be utilized in the electronic device 202. The device housing 102 includes the magnesium-alloy substrate 104, the treatment layer 106, the metallic coating layer 108, the paint coating layer 110, and the top coating layer 112. As previously described, the treatment layer 106 may be applied over the magnesium-alloy substrate 104 and may be one of the oxide layer or the passivation layer.

Further, the metallic coating layer 108 may be applied over the treatment layer 106. The metallic coating layer 108 may be one of the NCVM coating, PVD coating, or the VM coating. In one example, before applying the metallic coating layer, the magnesium-alloy substrate 104 having the treatment layer 106 may be subjected to CNC process using a diamond cutter to form the chamfer 404 having a glossy surface.

Further, the paint coating layer 110 may be applied over the metallic coating layer 108. In one example, the paint coating layer 110 may include a clear coating layer 502 applied over the metallic coating layer 108 and a base coating layer 504 applied over the clear coating layer 502. The base coating layer 504 may provide a colored texture to the device housing 102. The clear coating layer 502 may act as buffer layer that may be retained over the metallic coating layer 108, after the base coating layer 504 is removed to expose the metallic coating layer 108 for providing the metallic luster.

The clear coating layer 502 may include optical polymers selected from the group consisting of polyacrylic, polycarbonate, cyclic olefin copolymer (COC), and combinations thereof. In one example, the clear coating layer 502 may have a thickness in a range of from about 10 μm to about 30 μm. In another example, the clear coating layer 502 may have a thickness in a range of from about 12.5 μm to about 25 μm. In another example, the clear coating layer 502 may have a thickness in a range of from about 15 μm to about 20 μm.

The base coating 504 layer may be made of pigments including one of carbon black, titanium dioxide, clay, mica, talc, barium sulfate, calcium carbonate, synthetic pigment, metallic powder, aluminum oxide, an organic powder, an inorganic powder, graphene, graphite, plastic bead, color pigments, dyes, or combinations thereof. In one example, the base coating 504 may have a thickness in a range of from about 10 μm to about 25 μm. In another example, the base coating 504 may have a thickness in a range of from about 12.5 μm to about 20 μm. In another example, the base coating 504 may have a thickness in a range of from about 15 μm to about 18 μm.

Further, each of the base coating layer 504 and the clear coating layer 502 may be applied using a process of spray painting. In one example, the clear coating layer 502 may be spray coated onto the metallic coating layer 108 for a time period of about 20 to 60 minutes, and at a temperature range of about 50° C. to 110° C. In another example, the clear coating layer 502 may be spray coated onto the metallic coating layer 108 for a time period of about 40 minutes at about 80° C. In another example, the clear coating layer 502 may be spray coated onto the metallic coating layer 108 for a time period of about 30 to 50 minutes, and at a temperature range of about 50° C. to 110° C. In another example, the clear coating layer 502 may be spray coated onto the metallic coating layer 108 for a time period of about 30 to 50 minutes, and at a temperature range of about 70° C. to 90° C. In another example, the clear coating layer 502 may be spray coated onto the metallic coating layer 108 for a time period of about 35 to 45 minutes, and at a temperature range of about 70° C. to 90° C. In another example, the clear coating layer 502 may be spray coated onto the metallic coating layer 108 for a time period of about 35 to 45 minutes, and at a temperature range of about 50° C. to 110° C.

In one example, the base coating layer 504 may be spray coated onto the clear coating layer 502 for a time period of about 25 to 55 minutes, and at a temperature range of about 50° C. to 80° C. In another example, the base coating layer 504 may be spray coated onto the clear coating layer 502 for a time period of about 35 minutes at a temperature range of about 50° C. to 80° C. In another example, the base coating layer 504 may be spray coated onto the clear coating layer 502 for a time period of about 30 to 50 minutes, and at a temperature range of about 50° C. to 80° C. In another example, the base coating layer 504 may be spray coated onto the clear coating layer 502 for a time period of about 30 to 50 minutes, and at a temperature range of about 60° C. to 70° C. In another example, the base coating layer 504 may be spray coated onto the clear coating layer 502 for a time period of about 35 to 45 minutes, and at a temperature range of about 60° C. to 70° C. In another example, the base coating layer 504 may be spray coated onto the clear coating layer 502 for a time period of about 30 to 40 minutes, and at a temperature range of about 50° C. to 80° C.

Subsequently, a part of the paint coating layer 110 may be etched using one of diamond cutting and laser cutting process. In one example, a first part of the paint coating layer 110 remains applied over the first portion 204 of the metallic coating layer 108 and a second part of the paint coating layer 110 is removed from over the second portion 206 of the metallic coating layer 108. Thus, the second portion of the metallic coating layer 108 becomes visible, to provide a metallic luster to the device housing 102.

Further, in one example, the paint coating layer 110 may be partially removed from over the second portion 206 of the metallic coating layer 108, such that the clear coating layer 502 is retained over the second portion 206, while the base coating layer 504 is removed from over the second portion 206, as illustrated in a first view 506. In another example, the paint coating layer 110 may be removed in entirety from over the second portion 206 of the metallic coating layer 108, such that the clear coating layer 502 and the base coating layer 504 are removed from over the second portion 206, as illustrated in a second view 508.

Further, the top coating layer 112 may be applied over the paint coating layer 110 and the second portion 206 of the metallic coating layer 108 using spray coating.

Figure 6:
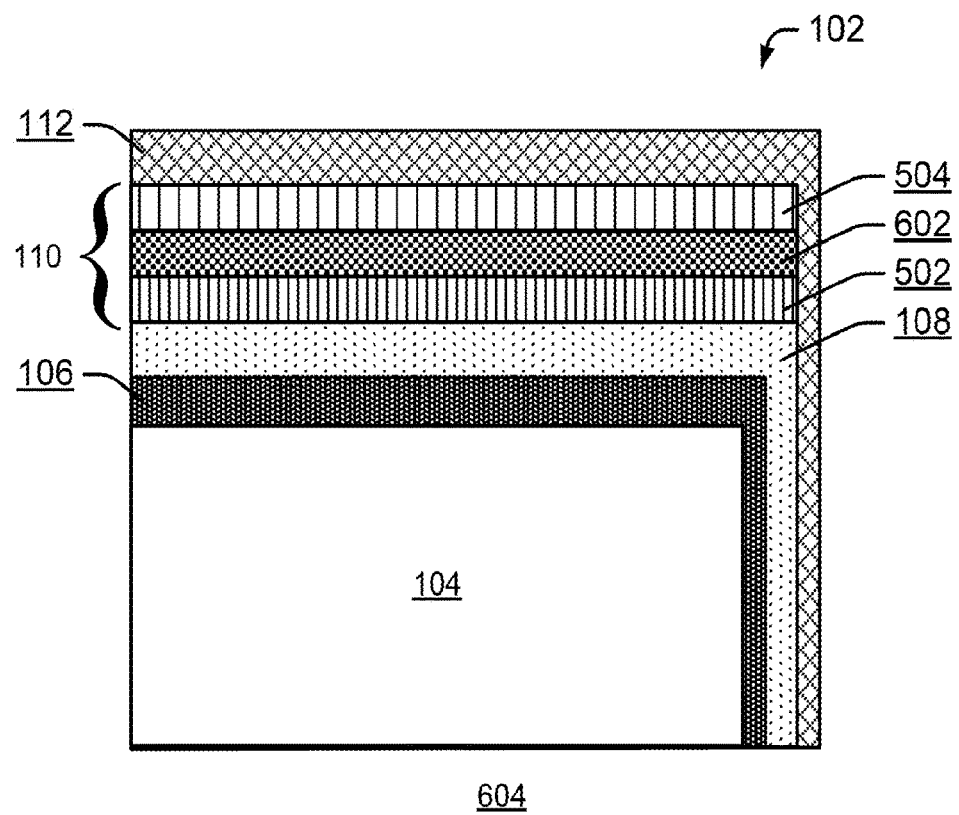
FIG. 6 illustrates a device housing, according to another example of the present application.
Figure 6:
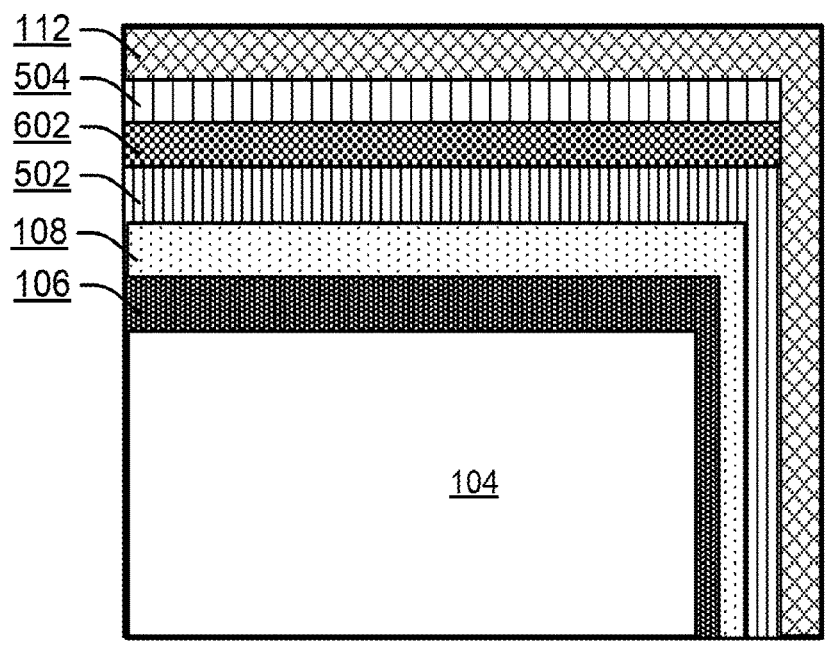

FIG. 6 illustrates the device housing 102, according to an example of the present application. The device housing 102 includes the magnesium-alloy substrate 104, the treatment layer 106 applied over the magnesium-alloy substrate 104, the metallic coating layer 108 applied over the treatment layer 106, the paint coating layer 110 applied over the metallic coating layer 108, and the top coating layer 112 applied over the paint coating layer 110.

In one example, the paint coating layer 110 may include the clear coating layer 502 applied over the metallic coating layer 108, a primer coating layer 602 applied over the clear coating layer 502, and the base coating layer 504 applied over the primer coating layer 602. As previously described, each coating layer may provide a defined functionality. For example, the primer coating layer 602 may act as an adhesive between the clear coating layer 502 and the base coating layer 504. In one example, the primer coating layer 602 may have a thickness in a range of from about 5 µm to about 20 µm. In another example, the primer coating layer 602 may have a thickness in a range of from about 10 µm to about 15 µm.

The primer coating layer 602 may be formed by spray coating a polyurethane over the clear coating layer 502. In one example, the primer coating layer 602 may be spray coated for a time period of about 30 to 50 minutes, and at a temperature range of about 60° C. to 100° C. In another example, the primer coating layer 602 may be spray coated for a time period of about 40 minutes and at a temperature at about 80° C. In another example, the primer coating layer 602 may be spray coated for a time period of about 30 to 50 minutes, range of about 70° C. to 90° C. In another example, the primer coating layer 602 may be spray coated for a time period of about 35 to 45 minutes, and at a temperature range of about 75° C. to 85° C. In another example, the primer coating layer 602 may be spray coated for a time period of about 35 to 45 minutes, and at a temperature range of about 50° C. to 80° C. In another example, the primer coating layer 602 may be spray coated for a time period of about 35 to 45 minutes, and at a temperature range of about 70° C. to 90° C.

Further, in one example, the paint coating layer 110 may be partially removed from over the second portion 206 of the metallic coating layer 108, such that the clear coating layer 502 is retained over the second portion 206, while the base coating layer 504 and the primer coating layer 602 are removed from over the second portion 206, as illustrated in a third view 604. In another example, the paint coating layer 110 may be removed in entirety from over the second portion 206 of the metallic coating layer 108, such that the clear coating layer 502, the base coating layer 504, and the primer coating layer 602 are removed from over the second portion 206, as illustrated in a fourth view 606.

Figure 7:
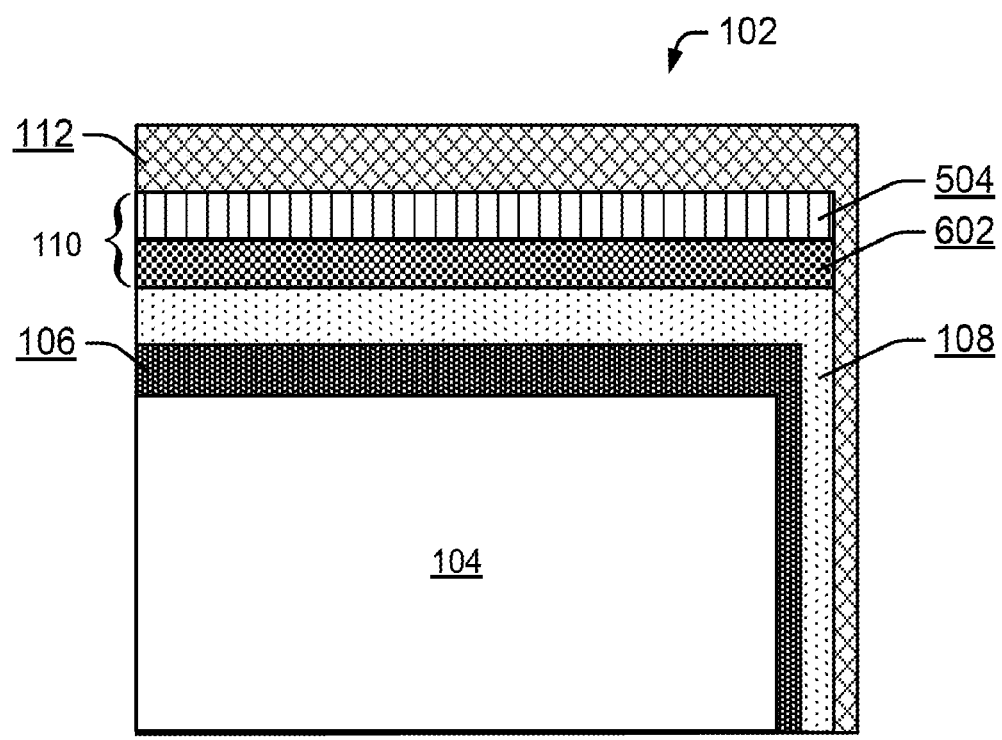
FIG. 7 illustrates a device housing, according to yet another example of the present application.

FIG. 7 illustrates the device housing 102, according to an example of the present application. The device housing 102 includes the magnesium-alloy substrate 104, the treatment layer 106, the metallic coating layer 108, the paint coating layer 110, and the top coating layer 112. As previously described, the treatment layer 106 may be applied over the magnesium-alloy substrate 104 using one of the MAO process or chemical treatment using a passivation chemical.

The metallic coating layer 108 may then be applied over the treatment layer 106. The metallic coating layer 108 may be applied using one of the NCVM process, the PVD process, and the VM process. In one example, before applying the metallic coating layer, the magnesium-alloy substrate 104 having the treatment layer 106 may be subjected to CNC process using a diamond cutter to form the chamfer 404 having a glossy surface.

Further, the paint coating layer 110 may be applied over the metallic coating layer 108. In one example, the paint coating layer 110 may include the primer coating layer 602 applied over the metallic coating layer 108 and the base coating layer 504 applied over the primer coating layer 602. The base coating layer 504 may provide a colored texture to the device housing 102. As previously described, the base coating layer 504 may provide a colored texture to the device housing 102. The primer coating layer 602 may act as an adhesive between the metallic coating layer 108 and the base coating layer 504.

The paint coating layer 110 may subsequently be etched using one of diamond cutting and laser cutting process such that the first part of the paint coating layer 110 remains applied over the first portion 204 of the metallic coating layer 108 and the second part of the paint coating layer 110 is removed from over the second portion 206 of the metallic coating layer 108. Thus, the second portion 206 of the metallic coating layer 108 becomes visible, to provide a metallic luster to the device housing 102.

The device housing 102 further includes the top coating layer 112 applied over the paint coating layer 110 and the second portion 206 of the metallic coating layer 108.

Figure 8:
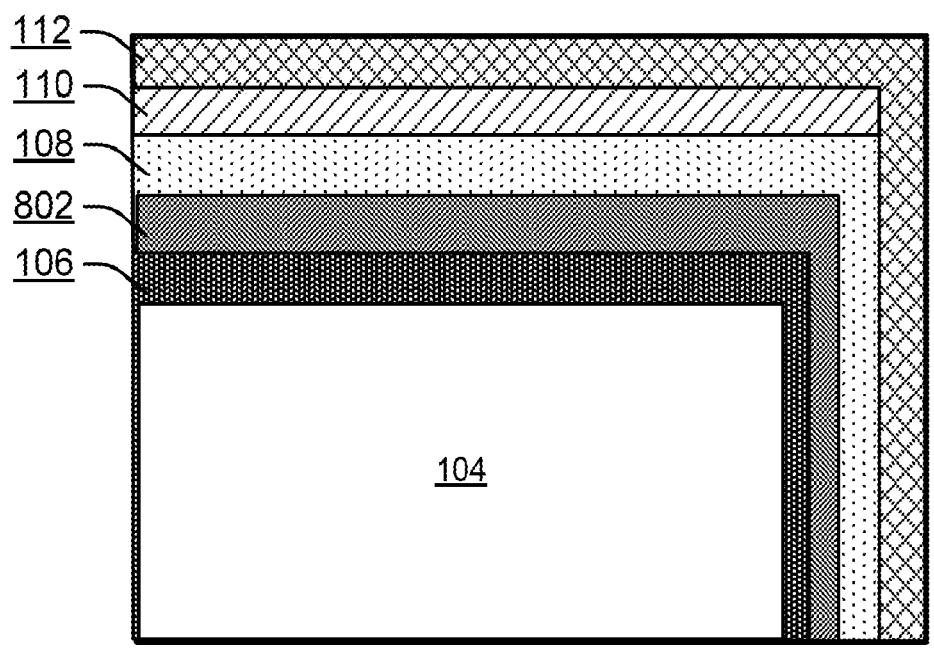
FIG. 8 illustrates a device housing, according to yet another example of the present application.

FIG. 8 illustrates the device housing 102, according to an example of the present application. The device housing 102 includes the magnesium-alloy substrate 104, the treatment layer 106, the metallic coating layer 108, the paint coating layer 110, and the top coating layer 112. As previously described, the treatment layer 106 may be applied over the magnesium-alloy substrate 104 may be one of an oxide layer and a passivation layer formed using the MAO process and chemical treatment using a passivation chemical, respectively.

The device housing 102 may further include a clear primer coating layer 802 applied over the treatment layer 106. Applying the clear primer coating layer helps in improving the deposition rate and performance of the metallic coating layer 108. The clear primer coating layer includes optical polymers selected from the group consisting of polyacrylic, polycarbonate, cyclic olefin copolymer (COC), and combinations thereof. In one example, the clear primer coating layer may have a thickness in the range of from about 10 µm to about 30 µm and may be applied using the process of spray painting, as previously described.

The metallic coating layer 108 may then be applied over the clear primer coating layer 802. In one example, the metallic coating layer 108 may be a NCVM coating applied using the NCVM process. In another example, the metallic coating layer 108 may be a PVD coating applied using the PVD process. In another example, the metallic coating layer 108 may be a VM coating applied using the VM process.

Further, the paint coating layer 110 may be applied over the metallic coating layer 108. The paint coating layer 110 may be further subjected to etching to remove a part of the paint coating layer 110 such that the paint coating layer 110 remains over the first portion 204 of the metallic coating layer 108, while the paint coating layer 110 is removed from over the second portion 206 of the metallic coating layer 108. Further, the top coating layer 112 may be applied over the paint coating layer 110 and the second portion 206 of the metallic coating layer 108.

Figure 9:
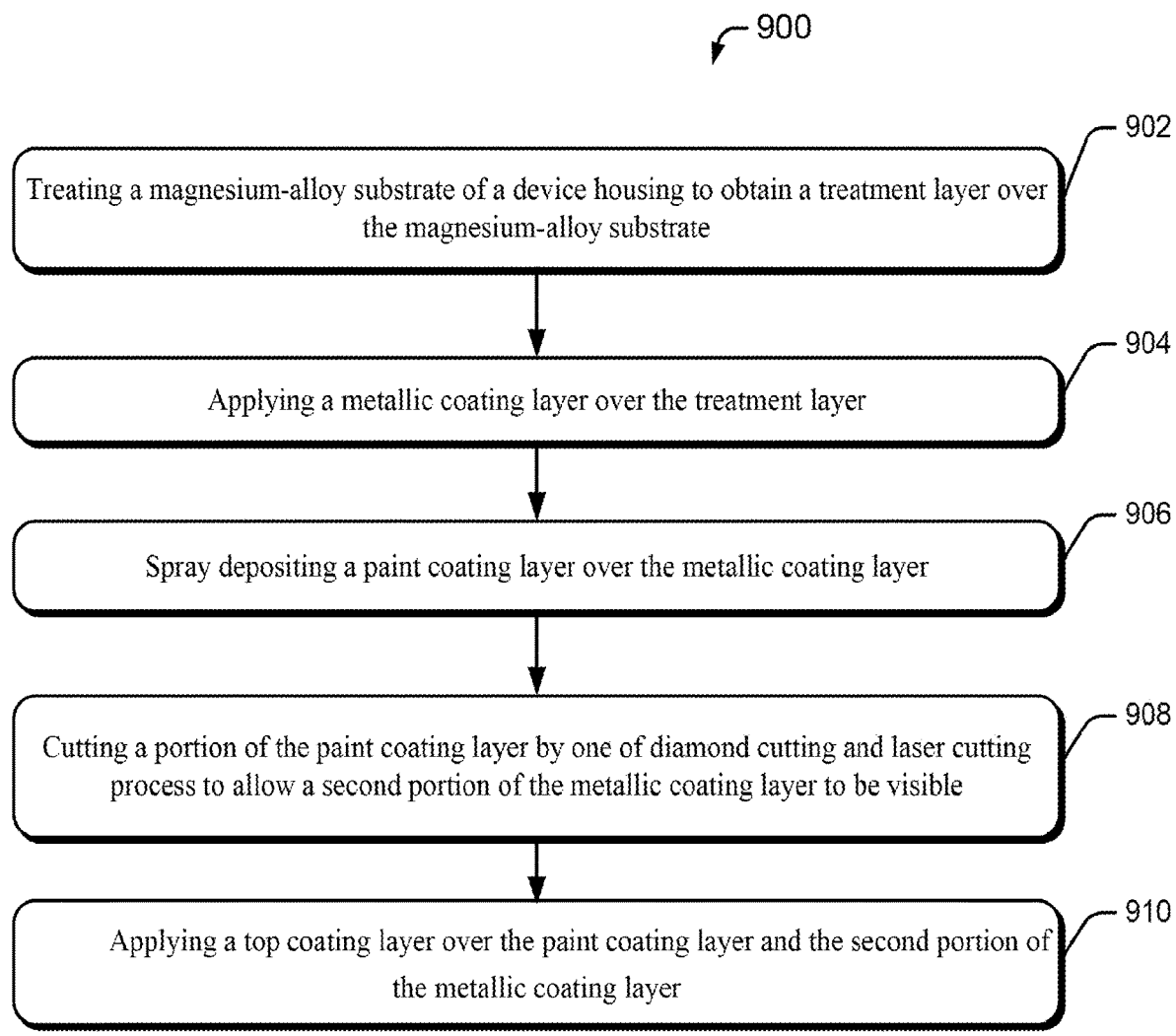
FIG. 9 illustrates a method of fabricating a device housing for an electronic device, according to another example of the present application.

FIG. 9 illustrates method 900 of fabricating a device housing for an electronic device, according to an example of the present application. While the method 900 is described in context of fabrication of the device housing 102 for electronic devices, the method 900 may be utilized for fabrication of other components as well.

At block 902, a magnesium-alloy substrate of a device housing is treated to obtain a treatment layer over the magnesium-alloy substrate. As previously described, the magnesium-alloy substrate, such as the magnesium-alloy substrate 104 of the device housing 102, may include magnesium, titanium, zinc, and an element selected from the group consisting of aluminum and lithium. In one example, the magnesium-alloy substrate 104 may be chemically treated to form the treatment layer, such as the treatment layer 106. In one example, the treatment layer may be an oxide layer formed by oxidizing the magnesium-alloy substrate through the MAO process. In another example, the treatment layer may be a passivation layer formed by chemically treating a surface of the magnesium-alloy substrate with a passivation chemical. The passivation chemical may be selected from the group consisting of molybdates, vanadates, phosphates, chromates, stannates, manganese salts, and combinations thereof.

At 904, a metallic coating layer is applied over the treatment layer. The metallic coating layer, such as the metallic coating layer 108 may be applied using one of the NCVM process, the PVD process, and the VM process. When formed using the NCVM process, the metallic coating layer may be a NCVM coating. When formed using the PVD process, the metallic coating layer may be a PVD coating. When formed using the VM process, the metallic coating layer may be a VM coating.

In one example, before applying the metallic coating layer, the magnesium-alloy substrate having the treatment layer may be subjected to CNC process to form a chamfer having a glossy surface. The CNC process may include cutting an edge of the treatment layer and the magnesium-alloy substrate using a diamond cutter to form the chamfer.

At block 906, a paint coating layer is spray deposited over the metallic coating layer. The paint coating layer, such as the paint coating layer 108, may help in providing color to the device housing. In one example, the paint coating layer may include one of a base coating layer, a clear coating layer, a primer coating layer, and combinations thereof.

At block 908, a second part of the paint coating layer may be cut by one of diamond cutting and laser cutting process to allow a second portion of the metallic coating layer to be visible, to provide a metallic luster to the housing. In one example, the paint coating layer may be partially removed from over the second portion of the metallic coating layer, such that the clear coating layer is retained over the second portion. The base coating layer and the primer coating layer are removed from over the second portion. In another example, the paint coating layer may be removed in entirety from over the second portion of the metallic coating layer, such that the second portion is directly visible and exposed to the environment.

At block 910, a top coating layer is applied over the paint coating layer and the second portion of the metallic coating layer. The top coating layer may help in protecting the paint coating layer and the second portion of the metallic coating layer from abrasion. In one example, the top coating layer may be spray coated over the paint coating layer and the second portion of the metallic coating layer.

EXAMPLES

The present application will now be illustrated with prophetic examples, which are intended to illustrate examples of the disclosure and not intended to be taken restrictively to imply any limitations on the scope of the present disclosure. Unless defined otherwise, all technical and scientific terms used herein have the same meaning as commonly understood to one of ordinary skill in the art to which this disclosure belongs. It is to be understood that this disclosure is not limited to the particular methods and experimental conditions described, as such methods and conditions may vary depending on the process and inputs used as will be easily understood by a person skilled in the art.

Prophetic Example 1

Process for Fabricating a Device Housing

The process for fabricating a device housing in accordance to the present application is depicted in FIGS. 3, 4, and 9.

Prophetic Example 2

A device housing for an electronic device is fabricated. Initially, a magnesium-alloy substrate is manufactured, as a chassis for the device housing. The magnesium-alloy substrate may be formed using a magnesium-alloy including magnesium, aluminum, and zinc. In said example, the magnesium-alloy includes magnesium in 9 weight percent aluminum and 1 weight percent zinc. A top surface of the magnesium-alloy substrate may then be subjected to chemical treatment using a passivation chemical to form a passivation layer as the treatment layer. The passivation chemical used for chemical treatment may be a phosphate. The top surface of the magnesium-alloy substrate may be chemically treated using the phosphate such that the top surface may react with the passivation chemical and turn into a nonmetallic surface, such as a salt film. The magnesium-alloy substrate may be chemically treated for a time duration in a range of about 0.5 minutes to 3 minutes and at a temperature range of about 25° C. to 40° C. to obtain the passivation layer. In one example, the passivation layer has a thickness in a range of about 1 µm to about 5 µm.

Further, a PVD coating is applied over the passivation layer, as metallic coating layer to provide metallic luster. In one example, the metallic coating layer 108 may have a thickness in a range of from about 30 nanometer (nm) to about 1 µm. The PVD coating may be made by depositing titanium using ion-beam sputtering in a high vacuum environment. The PVD coating may be applied under a pressure in a range of about $10^{-3}$ Torr-$10^{-4}$ Torr and at a temperature range of about 120° C. to 250° C.

The metallic coating layer and treatment layer coated magnesium-alloy substrate may be further subjected to spray coating to apply a paint coating layer over the metallic coating layer. The paint coating layer includes a clear coating layer applied over the metallic coating layer, a primer coating layer applied over the clear coating layer, and a base coating layer applied over the primer coating layer. The clear coating layer may be formed by spray coating polyacrylic over the metallic coating layer for a time period of about 40 minutes at about 80° C. The clear coating layer may have a thickness in a range of from about 10 µm to about 30 µm.

The primer coating layer may be formed by spray coating a polyurethane over the clear coating layer. In one example, the primer coating layer may be spray coated for a time period of about 30 to 50 minutes, and at a temperature range of about 60° C. to 100° C. The base coating layer may be formed by spray coating pigments of carbon black over the primer coating layer for a time period of about 35 minutes at a temperature range of about 50° C. to 80° C. In one example, the base coating 504 may have a thickness in a range of from about 10 µm to about 25 µm.

Further, the paint coating layer may be removed from over a second portion of the metallic coating layer, such that the clear coating layer is retained over the second portion, while the base coating layer and the primer coating layer are removed from over the second portion, as illustrated in a third view 604. Further, the clear coating layer, the base coating layer, and the primer coating layer are retained over a first portion of the metallic coating layer.

Further, a top coating layer may be spray painted over the paint coating layer and the second portion of the metallic coating layer. The top coating layer may be formed by spray coating polyurethane at a temperature range of about 80 to 140° C., for about 20 to 40 minutes. In one example, the top coating layer 112 has a thickness in a range of from about 10 µm to about 25 µm.

Although examples for the present application have been described in language specific to structural features and/or methods, it should be understood that the appended claims are not limited to the specific features or methods described. Rather, the specific features and methods are disclosed and explained as examples of the present application.

What is claimed is:

1. A device housing of an electronic device, comprising:
   a magnesium-alloy substrate;
   a treatment layer applied over the magnesium-alloy substrate, wherein the treatment layer is one of:
     an oxide layer having a thickness in a range of from about 3 µm to about 15 µm; or
     a passivation layer formed to obtain a non-metallic surface over the magnesium-alloy substrate, wherein the passivation layer has a thickness in a range of from about 1 µm to about 5 µm;
   a metallic coating layer applied over the treatment layer to provide a metallic luster;
   a paint coating layer disposed over a first portion of the metallic coating layer, wherein the paint coating layer comprises:
     a clear coating layer applied over the metallic coating layer;
     a primer coating layer applied over the clear coating layer; and
     a base coating layer applied over the primer coating layer; and
   a top coating layer applied over the paint coating layer and a visible second portion of the metallic coating layer.

2. The device housing as claimed in claim 1, wherein the metallic coating layer is one of:
   a non-conductive vacuum metallization (NCVM) coating having a thickness in a range of from about 30 nm to about 1 µm;
   a physical vapor deposition (PVD) coating having a thickness in a range of from about 30 nm to about 1 µm; or
   a vacuum metallization (VM) coating having a thickness in a range of from about 30 nm to about 1 µm.

3. The device housing as claimed in claim 2, wherein the NCVM coating, the PVD coating, and the VM coating are made of a material selected from the group consisting of titanium, chromium, nickel, zinc, zirconium, manganese, copper, aluminum, tin, molybdenum, tantalum, tungsten, hafnium, gold, vanadium, silver, platinum, graphite, stainless steel, and alloy combinations thereof.

4. The device housing as claimed in claim 1, wherein:
   the clear coating layer has a thickness in a range of from about 10 µm to about 30 µm;
   the primer coating layer has a thickness in a range of from about 5 µm to about 20 µm; and
   the base coating layer has a thickness in a range of from about 10 µm to about 25 µm.

5. The device housing as claimed in claim 1, wherein the clear coating layer includes optical polymers selected from the group consisting of polyacrylic, polycarbonate, cyclic olefin copolymer (COC), and combinations thereof.

6. The device housing as claimed in claim 1, wherein the base coating layer is made of pigments including one of carbon black, titanium dioxide, clay, mica, talc, barium sulfate, calcium carbonate, synthetic pigment, metallic powder, aluminum oxide, an organic powder, an inorganic powder, graphene, graphite, plastic bead, color pigments, dyes, or combinations thereof.

7. The device housing as claimed in claim 1, wherein:
   the top coating layer has a thickness in a range of from about 10 µm to about 25 µm, and
   the top coating layer includes resins selected from the group consisting of polyurethane, polycarbonate, urethane acrylates, ployacrylate, polystyrene, polyetheretherketone, polyesters, fluoropolymers, and combinations thereof.

8. An electronic device comprising a device housing to house different components of the electronic device, the device housing comprising:
   a magnesium-alloy substrate;
   a plurality of coating layers deposited over the magnesium-alloy substrate;
   wherein the plurality of coating layers include at least a treatment layer, a metallic coating layer, a paint coating layer, and a top coating layer, wherein the treatment layer is applied over the magnesium-alloy substrate and is one of:
     an oxide layer is having a thickness in a range of from about 3 µm to about 15 µm; or
     a passivation layer formed to obtain a non-metallic surface over the magnesium-alloy substrate, wherein the passivation layer has a thickness in a range of from about 1 µm to about 5 µm;
   wherein the metallic coating layer is applied over the treatment layer to provide a metallic luster;
   wherein the paint coating layer comprises:
     a clear coating layer applied over the metallic coating layer;
     a primer coating layer applied over the clear coating layer; and
     a base coating layer applied over the primer coating layer;

wherein the paint coating layer is disposed on a first portion of the metallic coating layer, and the top coating layer is applied over the paint coating layer and a visible second portion of the metallic coating layer.

9. The electronic device as claimed in claim 8, wherein:

the oxide layer is formed by a micro-arc oxidation (MAO) process using an electrolytic solution comprising electrolytes selected from the group consisting of sodium silicate, sodium phosphate, potassium fluoride, potassium hydroxide, sodium hydroxide, fluorozirconate, sodium hexametaphosphate, sodium fluoride, aluminum oxide, silicon dioxide, ferric ammonium oxalate, phosphoric acid salt, polyethylene oxide alkylphenolic ether, and combinations thereof; or the passivation layer is formed by chemically treating a surface of the magnesium- alloy substrate with a passivation chemical to obtain a non-metallic surface over the magnesium-alloy substrate, wherein the passivation chemical is selected from the group consisting of molybdates, vanadates, phosphates, chromates, stannates, manganese salts, and combinations thereof.

10. The electronic device as claimed in claim 8, wherein the plurality of coating layers further comprises:

a clear primer coating layer applied over the treatment layer, wherein the clear primer coating layer has a thickness in a range of from about 10 μm to about 30 μm; and the metallic coating layer applied over the clear primer coating layer, wherein the metallic coating layer is one of:
- a non-conductive vacuum metallization (NCVM) coating having a thickness in a range of from about 30 nm to about 1 μm;
- a physical vapor deposition (PVD) coating having a thickness in a range of from about 30 nm to about 1 μm; or
- a vacuum metallization (VM) coating having a thickness in a range of from about 30 nm to about 1 μm.

11. A method of forming a glossy surface on a device housing for an electronic device, the method comprising:

treating a magnesium-alloy substrate of the device housing to obtain a treatment layer over the magnesium-alloy substrate, wherein the treatment layer is one of:
- an oxide layer having a thickness in a range of from about 3 μm to about 15 μm; or
- a passivation layer formed to obtain a non-metallic surface over the magnesium-alloy substrate, wherein the passivation layer has a thickness in a range of from about 1 μm to about 5 μm;

applying a metallic coating layer over the treatment layer;

spray depositing a paint coating layer over the metallic coating layer, wherein the paint coating layer comprises:
- a clear coating layer applied over the metallic coating layer;
- a primer coating layer applied over the clear coating layer; and
- a base coating layer applied over the primer coating layer;

cutting a part of the paint coating layer by one of diamond cutting and a laser cutting process to allow a portion of the metallic coating layer to be visible, to provide a metallic luster to the housing; and applying a top coating layer over the paint coating layer and the second portion of the metallic coating layer.

12. The method as claimed in claim 11, wherein the method comprises:

cutting an edge of the treatment layer and the magnesium-alloy substrate by a Computer Numeric Control (CNC) process using a diamond cutter, to form a chamfer having a glossy surface.

13. The method as claimed in claim 11, wherein treating the magnesium-alloy substrate comprises one of:

oxidizing the magnesium-alloy substrate through micro-arc oxidation (MAO) process to form the oxide layer on the magnesium-alloy substrate, wherein the oxide layer is formed using an electrolytic solution comprising electrolytes selected from the group consisting of sodium silicate, sodium phosphate, potassium fluoride, potassium hydroxide, sodium hydroxide, fluorozirconate, sodium hexametaphosphate, sodium fluoride, aluminum oxide, silicon dioxide, ferric ammonium oxalate, phosphoric acid salt, polyethylene oxide alkylphenolic ether, and combinations thereof; or chemically treating a surface of the magnesium-alloy substrate with a passivation chemical to obtain the passivation layer, wherein the passivation layer includes a non- metallic surface, and wherein the passivation chemical is selected from the group consisting of molybdates, vanadates, phosphates, chromates, stannates, manganese salts, and combinations thereof.

* * * * *